United States Patent
Gockel et al.

(10) Patent No.: US 11,818,449 B2
(45) Date of Patent: Nov. 14, 2023

(54) METHOD FOR PRODUCING A CAMERA MODULE, CAMERA MODULE

(71) Applicant: Robert Bosch GmbH, Stuttgart (DE)

(72) Inventors: Michael Gockel, Nesselwang (DE); Andreas Moehrle, Stuttgart (DE); Nikolai Bauer, Moeglingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 17/387,549

(22) Filed: Jul. 28, 2021

(65) Prior Publication Data

US 2022/0046150 A1    Feb. 10, 2022

(30) Foreign Application Priority Data

Aug. 5, 2020    (DE) .......................... 102020209840.9

(51) Int. Cl.
*H04N 23/54* (2023.01)
*H05K 1/18* (2006.01)
*H05K 1/02* (2006.01)
*H05K 3/32* (2006.01)
*H04N 23/51* (2023.01)

(52) U.S. Cl.
CPC ............. *H04N 23/54* (2023.01); *H04N 23/51* (2023.01); *H05K 1/0274* (2013.01); *H05K 1/184* (2013.01); *H05K 3/328* (2013.01); *H05K 2201/10151* (2013.01)

(58) Field of Classification Search
CPC .. H04N 5/2253; H04N 5/2252; H04N 5/2257; H04N 5/2251; H04N 23/54; H04N 23/51; H04N 23/57; H04N 23/50; H05K 1/0274; H05K 1/184; H05K 3/328; H05K 2201/10151; H05K 3/365; H05K 3/4084; H05K 2201/0382; H05K 2201/09054; H05K 2201/09063; H05K 2203/0195; H05K 2203/167
See application file for complete search history.

(56) References Cited

U.S. PATENT DOCUMENTS 3,526,955 A     9/1970  Cilione
5,281,770 A  *  1/1994  Kamei .................. H01R 12/58
                                              174/266

(Continued)

FOREIGN PATENT DOCUMENTS

DE          573950 C    4/1933
DE         3201717 A1   7/1983

(Continued)

*Primary Examiner* — Jason A Flohre
(74) *Attorney, Agent, or Firm* — NORTON ROSE FULBRIGHT US LLP; Gerard Messina

(57) ABSTRACT

A method for producing a camera module having a first part, preferably a housing part, and a second part, preferably a circuit board or a cover part, in which the two parts are connected in positive locking fashion. The positive lock is produced in that a connecting element connected to the first part in the form of a tongue, sleeve or a pin is guided through an opening of the second part, the first part is brought to abut on the second part and subsequently the end of the connecting element protruding beyond the second part is curled in a deforming process so that the curled end abuts on the second part in a pretensioned manner. A camera module is also described.

15 Claims, 3 Drawing Sheets

(56) References Cited

U.S. PATENT DOCUMENTS

| | | | |
|---|---|---|---|
| 5,435,043 A * | 7/1995 | Ito | A41H 37/04 24/114.5 |
| 7,083,431 B1 * | 8/2006 | Darr | H01R 13/642 439/943 |
| 2007/0188692 A1 * | 8/2007 | Fukusako | H01L 23/50 257/E23.079 |
| 2012/0190252 A1 * | 7/2012 | Pavlinsky | H01M 10/425 439/775 |
| 2015/0226253 A1 * | 8/2015 | Park | F16B 37/062 411/39 |
| 2016/0268716 A1 * | 9/2016 | Conger | H01R 9/0518 |
| 2018/0013935 A1 * | 1/2018 | Kunze | H04N 5/2253 |
| 2018/0277291 A1 * | 9/2018 | Bickell | G01R 33/421 |
| 2018/0338070 A1 * | 11/2018 | Sigle | H04N 5/22521 |
| 2021/0197733 A1 * | 7/2021 | Percival | B60R 11/04 |
| 2021/0318507 A1 * | 10/2021 | Oh | G03B 17/02 |

FOREIGN PATENT DOCUMENTS

| | | |
|---|---|---|
| DE | 102012003737 A1 | 8/2013 |
| FR | 2426506 A1 | 12/1979 |
| JP | 2000120622 A | 4/2000 |

\* cited by examiner

METHOD FOR PRODUCING A CAMERA MODULE, CAMERA MODULE

CROSS REFERENCE

The present application claims the benefit under 35 U.S.C. § 119 of German Patent Application No. DE 102020209840.9 filed on Aug. 5, 2020, which is expressly incorporated herein by reference in its entirety.

FIELD

The present invention relates to a method for producing a camera module. The present invention furthermore relates to a camera module.

The camera module is usable, for example, in the automotive sector, for example for environment monitoring. Mobile terminals from the consumer sector and/or professional or scientific applications represent alternative areas of application.

BACKGROUND INFORMATION

Conventional camera or imager modules have an image sensor and a circuit board for preprocessing the information of the image sensor. During the assembly of the camera module, the image sensor is usually mounted on the circuit board. The circuit board in turn is connected to a housing part of the camera module. The housing part may be in particular a lens holder for accommodating a lens of the camera module. Furthermore, a cover part may be provided for closing the housing part. The cover part is likewise connected to the housing part for this purpose.

The connection of the circuit board and/or of the cover part to the housing part normally occurs by way of a screwed connection or adhesive connection. These have the disadvantage, however, that the connection may loosen over time due to relaxation processes and/or due to thermally induced linear deformations. If this occurs in the connection of the cover part to the housing part, the housing is no longer closed tightly. If this occurs in the connection of the circuit board to the housing part, it is possible that the position of the image sensor changes in relation to the image axis of the lens so that the camera module no longer produces sharp images. It is thus imperative to prevent a loosening of the connections.

An objection of the present invention is to provide a method and camera module for addressing this issue. Advantageous developments of the present invention may be gathered from the disclosure herein.

SUMMARY

A method in accordance with an example embodiment of the present invention may be used to produce a camera module having a first part, preferably a housing part, and a second part, preferably a circuit board or a cover part. According to the method in accordance with the example embodiment of the present invention, the two parts are connected in positive locking fashion. According to the present invention, the positive lock is produced in that a connecting element connected to the first part in the form of a tongue, sleeve or a pin is guided through an opening of the second part, the first part is brought to abut on the second part and subsequently the end of the connecting element protruding beyond the second part is curled in a deforming process so that the curled end abuts on the second part in a pretensioned manner.

The pretension is able to compensate for relaxation processes and/or thermally induced linear deformations, so that the connection does not loosen even in the long term. With the aid of the method in accordance with an example embodiment of the present invention, it is thus possible to achieve a permanently secure connection of the two parts.

The pretension is produced via the curled end of the connecting element, since in the deformation the latter is deformed not only plastically, but also elastically and thus acts like a spring. In addition, in its cross section, the curled end preferably does not form a closed roll, but rather forms an open roll or a bulge, which additionally increases the spring effect.

Depending on the shape of the connecting element, the curled end may form a straight or a ring-shaped bulge. A straight bulge is achieved for example when using a simple tongue as the connecting element. The end may be curled alternatively toward one or toward the other side. When using a sleeve as the connecting element, the end is curled circularly outward, so that a ring-shaped bulge is produced. Further roll or bulge shapes are likewise possible.

Preferably, in a preceding step, the opening for receiving the connecting element is produced in the second part, preferably in the circuit board or the cover part. The opening may be produced for example by punching or drilling. This depends, among other things, on the shape and/or the size of the opening. Preferably, the shape and/or size of the opening are/is adapted to the shape and/or size of the connecting element connected to the first part. This ensures that the curled end of the connecting element comes to rest securely on the second part and that the connecting element is not able to "slip through".

The connecting element connected to the first part, which is guided through the opening of the second part, may have been formed together with the first part or may be a separate component, which is connected later to the first part. If the latter is the case, then the connecting element is connected to the first part preferably in a preceding step, that is, before the connecting element is guided through the opening of the second part and deformed. The connection may be produced for example by a welded joint.

The connecting element may be a simple tongue, a sleeve or a pin. If the connecting element is a pin, the use of a slotted pin is suggested. The slot preferably divides the pin into two halves so that the connecting element is more readily deformable, since the deformation requires lesser forces. Furthermore, the forming tool may be inserted into the slot in such a way that one half of the pin is curled toward one side and the other half of the pin is curled toward the other side. The pretension forces for holding down the second part are thus introduced symmetrically with respect to the opening formed in the second part.

The curling of the protruding end of the tongue-shaped, sleeve-shaped or pin-shaped connecting element may be achieved by rimming for example. A rimming machine having a suitable rimming tool is used for rimming. The shape of the rimming tool is chosen in such a way that it deforms the end of the connecting element protruding beyond the second part in the desired manner.

For deforming the end of the connecting element protruding beyond the second part, a forming tool having at least one concavely shaped surface is preferably used. If the forming tool is brought to abut against the protruding end of the connecting element via the concavely shaped surface and is driven further in the direction of the two parts to be joined, the protruding end of the connecting element slides past the concavely formed surface and is thereby deformed into a roll.

In accordance with an example embodiment of the present invention, for achieving the objective mentioned at the outset, a camera module is further provided, having a first part, preferably a housing part, and a second part, preferably a circuit board or a cover part. The two parts are joined in a positive locking manner. According to an example embodiment of the present invention, the positive lock is produced by a connecting element connected to the first part in the form of a tongue, sleeve or a pin, which is guided through an opening of the second part abutting against the first part and which has a curled end that abuts against the second part in a pretensioned manner.

The pretension is achieved via the curled end of the connecting element, since this acts like a spring. For optimizing the spring effect, it is provided that the curled end forms in its cross section an open roll or a bulge. Depending on whether a tongue, a sleeve or a pin is used as the connecting element, the bulge may be straight or ring-shaped.

Via the spring action of the curled end of the connecting element it is possible to achieve a particularly durable connection of the two parts of the camera module, since relaxation processes and/or thermally induced linear deformations occurring over time may be compensated.

According to a preferred specific embodiment of the present invention, the shape and/or size of the opening of the second part are/is adapted essentially to the shape and/or size of the connecting element connected to the first part. This ensures that the curled end of the connecting element comes to rest securely on the second part of the camera module.

The connecting element may be formed by the first part or may be connected to the first part, for example welded together. Which specific embodiment is able to be produced more simply and thus more cost-effectively depends, among other things, on the shape of the connecting element.

If the connecting element is a pin, the latter is preferably slotted. That is to say that two curled halves of the pin abut on the second part of the camera module in a pretensioned manner. The two halves of the pin are curled toward different sides so that the pretension force is introduced symmetrically into the second part in relation to the opening formed in the second part.

Depending on the shape of the connecting element, the curled end may form a straight bulge, a ring-shaped bulge or two bulges running essentially in parallel.

Preferred specific embodiments of the present invention are explained below in greater detail with reference to the figures.

DETAILED DESCRIPTION OF EXAMPLE EMBODIMENTS

Figure 1A:
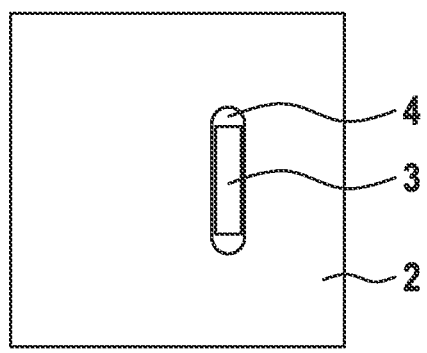
FIGS. 1a-1c show a first specific embodiment of the present invention for connecting two parts of a camera module, a) in a top view prior to the deforming process, b) in a longitudinal section during the deforming process and c) in a top view following the deforming process.
Figure 1B:
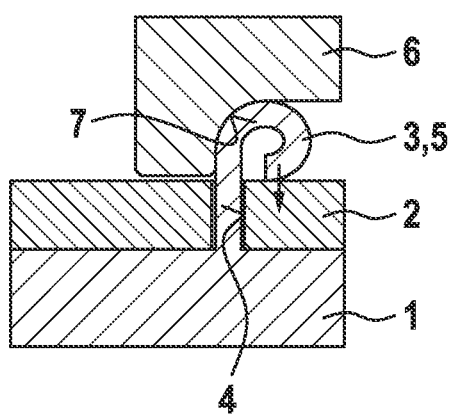
Figure 1C:
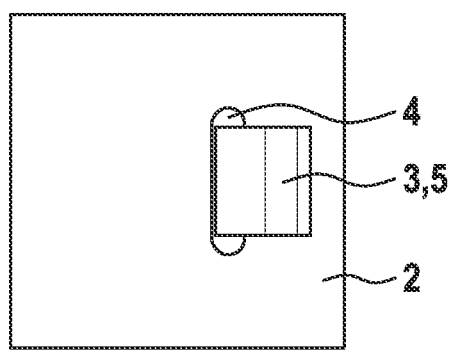

A first preferred specific embodiment of a method according to the present invention for producing a camera module may be gathered from FIGS. 1a-1c. In the production of the camera module, two parts 1, 2 must be connected to one another in a durably fixed manner. The first part 1 is in the present case a housing part having a connecting element 3 in the form of a tongue. The second part 2 is in the present case a circuit board having a slot-shaped opening 4. In order to connect the two parts 1, 2, the tongue (connecting element 3) is guided through opening 4 so that the two parts 1, 2 abut upon one another. Subsequently, the end 5 of the tongue (connecting element 3) protruding beyond second part 2 is curled with the aid of a forming tool 6 so that the curled end 5 abuts on second part 2 in a pretensioned manner (see arrow in FIG. 1b). For this purpose, forming tool 6 has a concavely shaped surface 7.

Figure 2A:
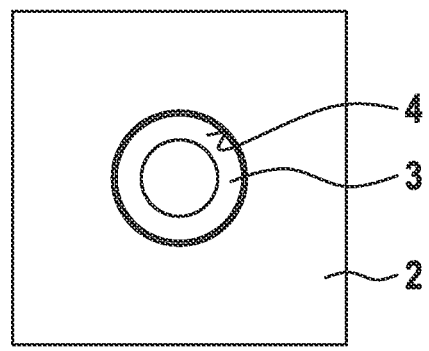
FIGS. 2a-2c show a second specific embodiment of the present invention for connecting two parts of a camera module, a) in a top view prior to the deforming process, b) in a longitudinal section during the deforming process and c) in a top view following the deforming process.
Figure 2B:
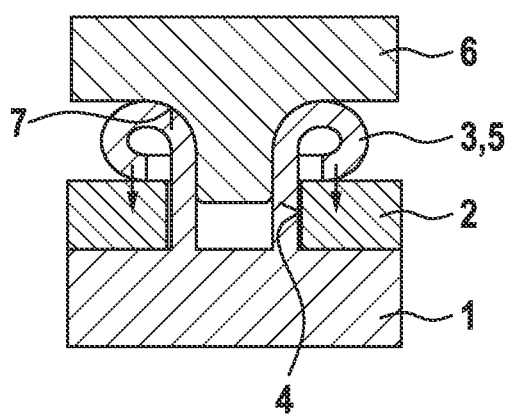
Figure 2C:
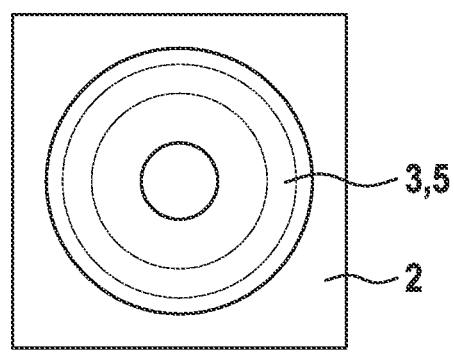

A second preferred specific embodiment of a method according to the present invention for producing a camera module may be gathered from FIGS. 2a-2c. Here, the first part 1, preferably a housing part, has a sleeve-shaped connecting element 3, which is guided through a circular opening 4 of the second part 2, for example a circuit board or a cover part. The protruding end 5 of the sleeve (connecting element 3) is curled in circular fashion with the aid of a forming tool 5 so that a circular bulge is formed, which abuts on second part 2 in a pretensioned manner (see arrows in FIG. 2b). For this purpose, forming tool 6 has a concavely shaped surface 7 running concentrically with respect to the sleeve.

Figure 3A:
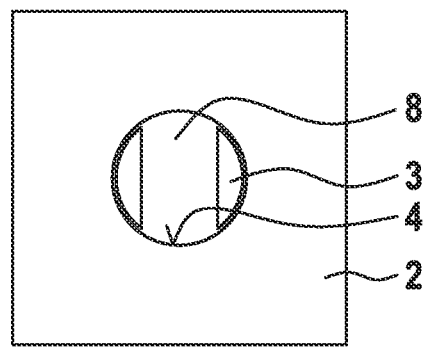
FIGS. 3a-3c show a third specific embodiment of the present invention for connecting two parts of a camera module, a) in a top view prior to the deforming process, b) in a longitudinal section during the deforming process and c) in a top view following the deforming process.
Figure 3B:
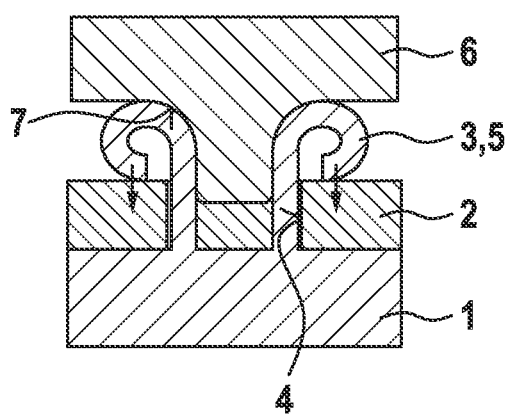
Figure 3C:
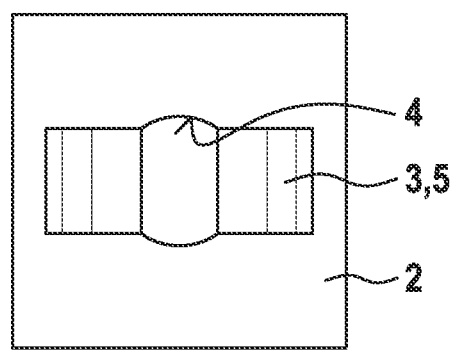

A third preferred specific embodiment of a method according to the present invention for producing a camera module may be gathered from FIGS. 3a-3c. Here, the connecting element 3 connected to first part 1 is embodied as a slotted pin. A slot 8 divides the pin into two halves. The ends 5 of the two halves of the pin protruding beyond second part 2 are respectively curled and abut on second part 2 in a pretensioned manner (see arrows in FIG. 3b). Forming tool 6 for curling the two ends 5 has two concavely shaped surfaces 7, which are arranged in mirror-symmetric fashion with respect to slot 8. Due to slot 8, the deformation may be effected with little force.

What is claimed is:

1. A method for producing a camera module having a first part, and a second part, in which the first part and the second part are connected in a positive locking manner, the method comprising:
    producing a positive lock by guiding a connecting element, connected to the first part in the form of a slotted pin, through an opening of the second part;
    bringing the first part to abut on the second part; and
    wherein ends of the slotted pin protrude outwardly from the second part by curling the ends downwardly in a deforming process to provide curled ends which extend downwardly toward upper surfaces of the second part so that the curled ends abut on the upper surfaces of the second part in a pretensioned manner, wherein the slotted pin is guided through a circular opening of the second part, so that protruding ends of the slotted pin are curled so that ends of a circular bulge abuts on the second part in the pretensioned manner, wherein a slot divides the slotted pin into two halves, and wherein ends of the two halves of the slotted pin protruding beyond the second part are respectively curled and abut on the second part in the pretensioned manner, and wherein the ends of the two halves of the pin are adapted to be curled by a forming tool, wherein the forming tool has two concavely shaped surfaces, which are arranged in a mirror-symmetric manner with respect to the slot of the slotted pin.

2. The method as recited in claim 1, wherein the first part is a housing part and the second part is a circuit board or a cover part.

3. The method as recited in claim 1, wherein, in a step preceding the guiding, producing the opening in the second part by punching or drilling, a shape and/or size of the opening, which is adapted to a shape and/or size of the connecting element connected to the first part.

4. The method as recited in claim 1, wherein, in a step preceding the guiding, the connecting element is connected to the first part.

5. The method as recited in claim 4, wherein the connecting element is connected to the first part by a welded joint.

6. The method as recited in claim 1, wherein the connecting element is the slotted pin.

7. The method as recited in claim 1, wherein for the curling of the end of the connecting element protruding beyond the second part, a forming tool having at least one concavely shaped surface is used.

8. A camera module, comprising:
a first part; and
a second part;
wherein the first part and the second part are connected in a positive locking manner, and
wherein a positive lock is produced by a connecting element, connected to the first part in the form of a slotted pin, which is guided upwardly through an opening of the second part for abutting against the first part, and wherein ends of the slotted pin protrude outwardly from the second part by curling the ends downwardly in a deforming process to provide curled ends which extend downwardly toward upper surfaces of the second part so that the curled ends abut on the upper surfaces of the second part in a pretensioned manner, wherein the slotted pin is guided through a circular opening of the second part, so that protruding ends of the slotted pin are curled so that ends of a circular bulge abuts on the second part in the pretensioned manner, wherein a slot divides the slotted pin into two halves, and wherein ends of the two halves of the slotted pin protruding beyond the second part are respectively curled and abut on the second part in the pretensioned manner, and wherein the ends of the two halves of the pin are adapted to be curled by a forming tool.

9. The camera module as recited in claim 8, wherein the first part is a housing part, and the second part is a circuit board or a cover part.

10. The camera module as recited in claim 8, wherein a shape and/or size of the opening of the second part, is adapted to a shape and/or size of the connecting element connected to the first part.

11. The camera module as recited in claim 8, wherein the connecting element is formed by the first part or is connected to the first part.

12. The camera module as recited in claim 8, wherein the connecting element is welded to the first part.

13. The camera module as recited in claim 8, wherein the connecting element is the slotted pin.

14. The camera module as recited in claim 8, wherein the curled end forms a straight bulge or a ring-shaped bulge or two bulges running in parallel.

15. The camera module as recited in claim 8, wherein the forming tool has two concavely shaped surfaces, which are arranged in a mirror-symmetric manner with respect to the slot of the slotted pin.

\* \* \* \* \*